(12) United States Patent
Chen et al.

(10) Patent No.: US 10,748,829 B2
(45) Date of Patent: Aug. 18, 2020

(54) ENCAPSULATION STRUCTURE FOR IMAGE SENSOR CHIP AND METHOD FOR MANUFACTURING THE SAME

(71) Applicants: TRIPLE WIN TECHNOLOGY(SHENZHEN) CO.LTD., Shenzhen (CN); HON HAI PRECISION INDUSTRY CO., LTD., New Taipei (TW)

(72) Inventors: Chia-Wei Chen, New Taipei (TW); Shin-Wen Chen, New Taipei (TW)

(73) Assignee: TRIPLE WIN TECHNOLOGY(SHENZHEN CO.LTD., Shenzhen (CN)

( * ) Notice: Subject to any disclaimer, the term of this patent is extended or adjusted under 35 U.S.C. 154(b) by 1 day.

(21) Appl. No.: 16/170,038

(22) Filed: Oct. 25, 2018

(65) Prior Publication Data

US 2019/0393113 A1 Dec. 26, 2019

(30) Foreign Application Priority Data

Jun. 26, 2018 (CN) .......................... 2018 1 0670027

(51) Int. Cl.
*H01L 23/31* (2006.01)
*H04N 5/225* (2006.01)
*H01L 27/146* (2006.01)

(52) U.S. Cl.
CPC .... *H01L 23/3114* (2013.01); *H01L 27/14627* (2013.01); *H01L 27/14632* (2013.01); *H04N 5/2253* (2013.01)

(58) Field of Classification Search
CPC combination set(s) only.
See application file for complete search history.

(56) References Cited

U.S. PATENT DOCUMENTS

| 2003/0201507 A1* | 10/2003 | Chen ................. H01L 27/14618 257/433 |
| 2005/0161587 A1* | 7/2005 | Mihara ............... H01L 21/6835 250/214 R |
| 2009/0045476 A1* | 2/2009 | Peng ................. H01L 27/14618 257/432 |
| 2010/0110692 A1* | 5/2010 | Yu ......................... H01L 33/483 362/294 |

(Continued)

FOREIGN PATENT DOCUMENTS

| TW | 544889 | 8/2003 |
| TW | 200539432 | 12/2005 |

(Continued)

*Primary Examiner* — Nduka E Ojeh
(74) *Attorney, Agent, or Firm* — ScienBiziP, P.C.

(57) ABSTRACT

An encapsulation structure to protect an image sensor chip at all times during manufacture and use includes a printed circuit board, an image sensor chip, a supporting portion, a protecting film and a package portion. The image sensor chip is mounted on the printed circuit board and the supporting portion is mounted on the printed circuit board to surround the image sensor chip. The package portion is entirely opaque and is formed on the printed circuit board, the package portion encloses side wall of the supporting portion and the protecting film, and portion of surface of the protecting sheet away from the image sensor chip.

20 Claims, 7 Drawing Sheets

(56) References Cited

U.S. PATENT DOCUMENTS

| | | | |
|---|---|---|---|
| 2011/0156188 A1* | 6/2011 | Tu .................... | H01L 27/14618 |
| | | | 257/432 |
| 2012/0249822 A1* | 10/2012 | Yoshida ............ | H01L 27/14618 |
| | | | 348/222.1 |
| 2014/0015116 A1* | 1/2014 | Fu ........................ | H01L 23/552 |
| | | | 257/659 |

FOREIGN PATENT DOCUMENTS

| | | |
|---|---|---|
| TW | 201123368 | 7/2011 |
| TW | M455258 | 6/2013 |

* cited by examiner

ENCAPSULATION STRUCTURE FOR IMAGE SENSOR CHIP AND METHOD FOR MANUFACTURING THE SAME

FIELD

The subject matter herein generally relates to packaging of components.

BACKGROUND

A chip encapsulation structure is for a printed circuit board and an image sensor chip to be mounted on the printed circuit board. Before the chip encapsulation structure is assembled to a lens module, it is exposed to the air for some time, and the image sensor chip can be polluted because of dust and fragments.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
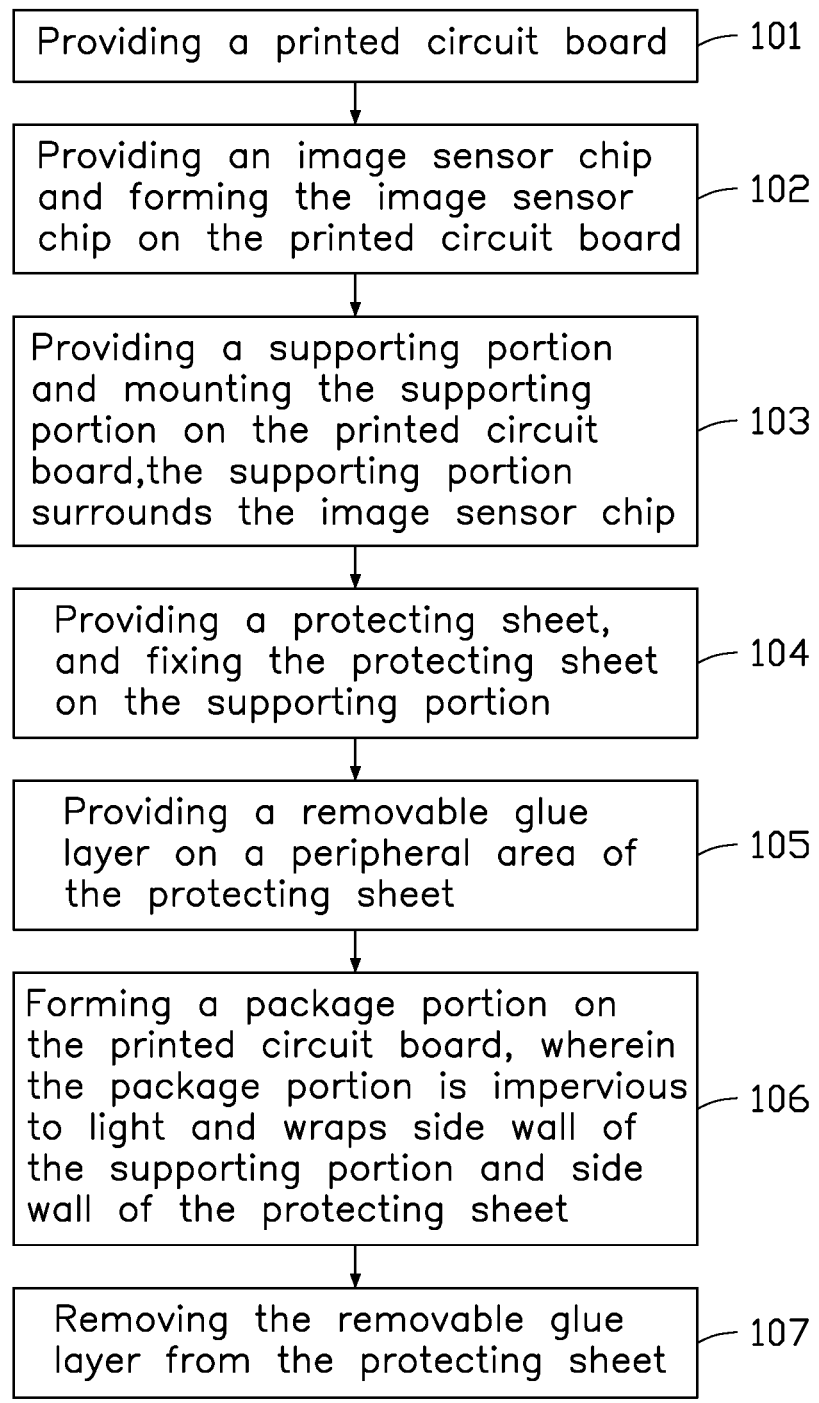
FIG. 1 is a flowchart of a manufacturing method for the chip encapsulation structure in FIG. 9.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 10:
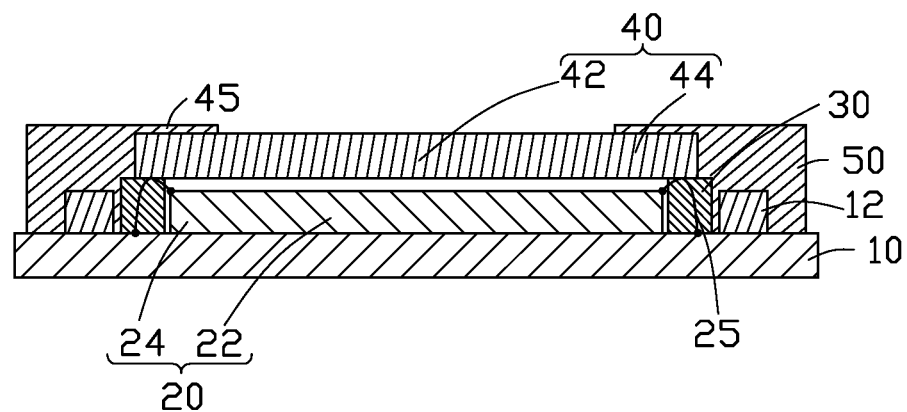
FIG. 10 is a cross-sectional of the removable glue layer in FIG. 8 removed.
Figure 11:
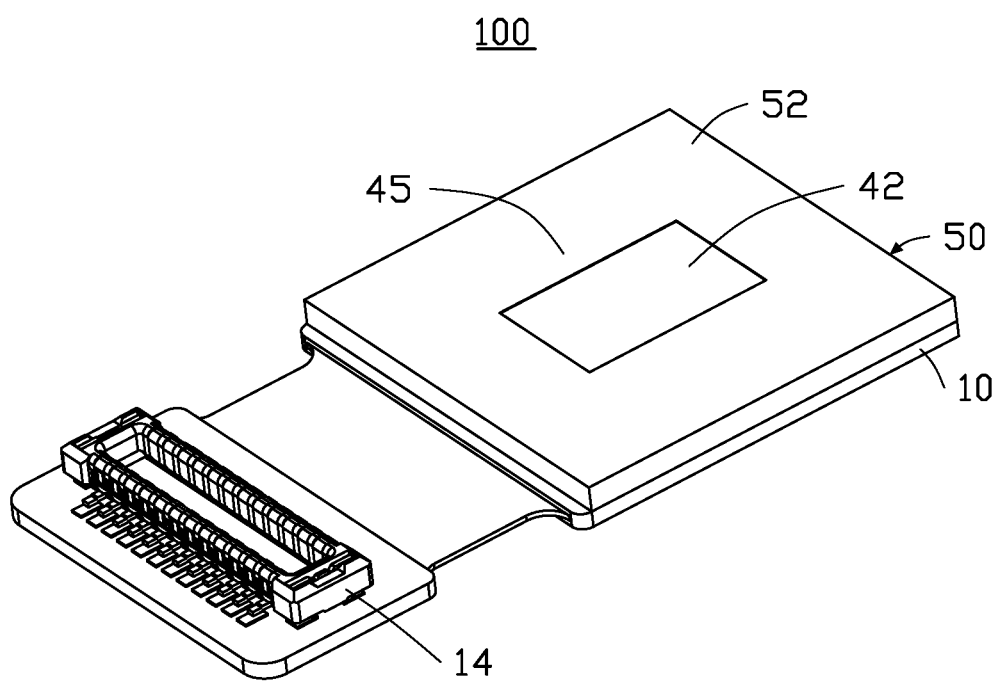
FIG. 11 is an isometric view of the chip encapsulation structure in FIG. 9 in accordance with one embodiment.

FIGS. 10-11 illustrate a chip encapsulation structure 100 used in an camera device, according to one embodiment. The chip encapsulation structure 100 includes a printed circuit board 10, an image sensor chip 20, a supporting portion 30, a protecting sheet 40, and a package portion 50.

The printed circuit board 10 can be a flexible circuit board or a rigid-flexible board. In the illustrated embodiment, the printed circuit board 10 is a ceramic board.

The printed circuit board 10 is provided with circuit components 12 and a connector 14. In this embodiment, the circuit components 12 are mounted on an edge area of the printed circuit board 10. The circuit components 12 are electrically connected to the image sensor chip 20. The circuit components 12 may be, but are not limited to, resistors, capacitors, diodes, transistors, potentiometers, relays, and drivers, etc. The connector 14 is electrically connected to the image sensor chip 20 for signal transmission between the image sensor chip 20 and an electronic device.

The image sensor chip 20 is mounted on a central area of the printed circuit board 10 and electrically connected to the printed circuit board 10 via the wires 25. The image sensor chip 20 includes a photosensitive area 22 surrounded by a non-photosensitive area 24.

Figure 5:
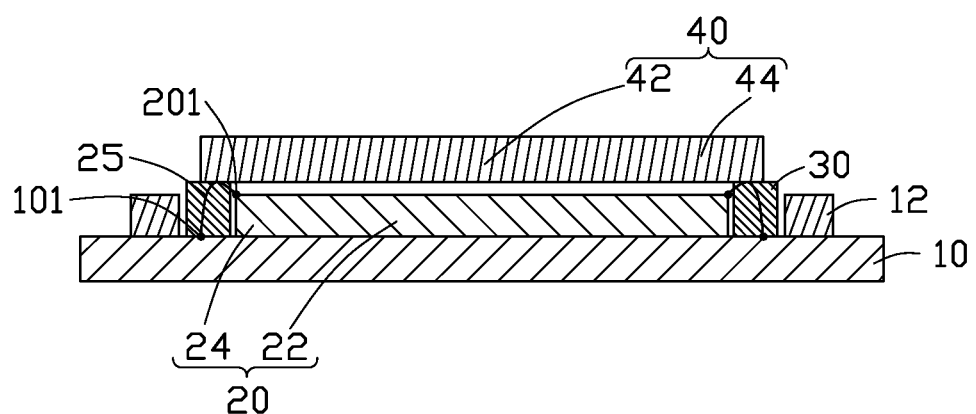
FIG. 5 is a cross-sectional view of a supporting portion formed on the printed circuit board and a protecting sheet formed on the supporting portion.

As shown in FIG. 5, the supporting portion 30 surrounds the image sensor chip 20 and encloses the wires 25, to avoid the wires 25 detaching from the printed circuit board 10, and to provide a support for the protecting sheet 40. The supporting portion 30 protrudes upwards from a top surface of the image sensor chip 20. The supporting portion 30 is substantially a square frame. A material of the supporting portion 30 is a colloid, which is dark to absorb stray light and to prevent ghosting. The supporting portion 30 is formed on the printed circuit board 10 by coating. In other embodiment, the supporting portion 30 may also be cylinders arranged independently around the image sensor chip 20. The number of cylinders may be the same as the number of wires 25, each cylinder encloses a wire 25 and the cylinders together support the protecting sheet 40.

The protecting sheet 40 is fixed on the supporting portion 30, and the protecting sheet 40 is spaced from the image sensor chip 20. A size of the protecting sheet 40 is larger than a size of the image sensor chip 20, and the image sensor chip 20 is sealed in a space formed by the printed circuit board 10, the supporting portion and the protecting sheet 40. In the shown embodiment, the protecting sheet 40 is an infrared cut-off filter to filter out infrared light. The protecting sheet 40 may also be a color filter. The protecting sheet 40 is configured to protect the image sensor chip 20, and avoid dust and fragments from falling on the image sensor chip 20.

The protecting sheet 40 defines a light transmission area 42 and a peripheral area 44 surrounding the light transmission area 42 along an optical path of a lens module. The light transmission area 42 corresponds to the photosensitive area position 22.

The package portion 50 has complete opacity. The package portion 50 is mounted on the printed circuit board 10 and wraps the side wall of the printed circuit board 10, side wall of the supporting frame 30, and the peripheral area 44 of the protecting sheet 40. A material of the package portion 50 is plastic or resin, and color of the package portion 50 is black or other dark color. The package portion 50 located on the peripheral area 44 forms a light shielding layer 45. A thickness of the light shielding layer 45 is in a range from 0.1 millimeters to 0.3 millimeters.

When the chip encapsulation structure 100 is assembled with a lens module 60 to form a camera device 110, the light shielding layer 45 absorbs stray light and prevents ghosting.

FIG. 1 illustrates a method for manufacturing an image sensor chip encapsulation structure according to one embodiment. The method 1 is provided by way of example as there are a variety of ways to carry out the method. The method 1 can begin at block 101.

Figure 2:
FIG. 2 is a cross-sectional view of a printed circuit board.

At block 101, as shown in FIG. 2, a printed circuit board 10 is provided. The printed circuit board 10 is provided with circuit members 12 and an electric connector 14, as shown in FIG. 5. The printed circuit board 10 can be selected from, but is not limited to, a flexible circuit board, rigid-flexible board, or ceramic substrates, etc. In this embodiment, the circuit components 12 are mounted at an edge area of the printed circuit board 10. The circuit components 12 are electrically connected to the image sensor chip 20. The circuit components 12 may be, but are not limited to, resistors, capacitors, diodes, transistors, potentiometers, relays, and drivers. The electric connector 14 is electrically connected to the image sensor chip 20 to realize transmissions between the image sensor chip 20 and an electronic device.

Figure 3:
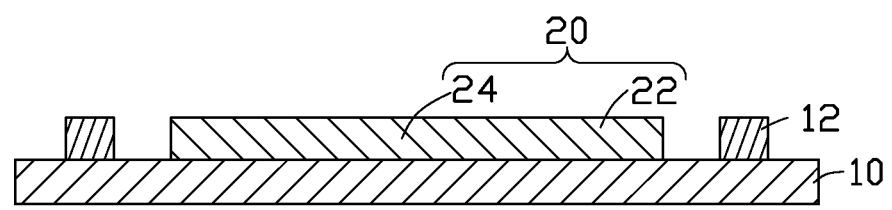
FIG. 3 is a cross-sectional view of an image sensor chip on the printed circuit board in FIG. 2.

At block 102, as shown in FIG. 3, an image sensor chip 20 is provided, and the image sensor chip 20 is mounted on the printed circuit board 10 and electrically connected to the printed circuit board 10. The image sensor chip 20 includes a photosensitive area 22 and a surrounding non-photosensitive area 24.

Figure 4:
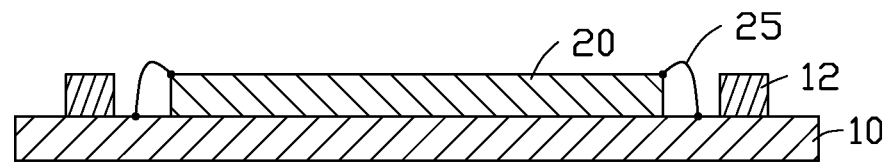
FIG. 4 is a cross-sectional view of the image sensor chip and the printed circuit board in FIG. 3 when electrically connected.
Figure 6:
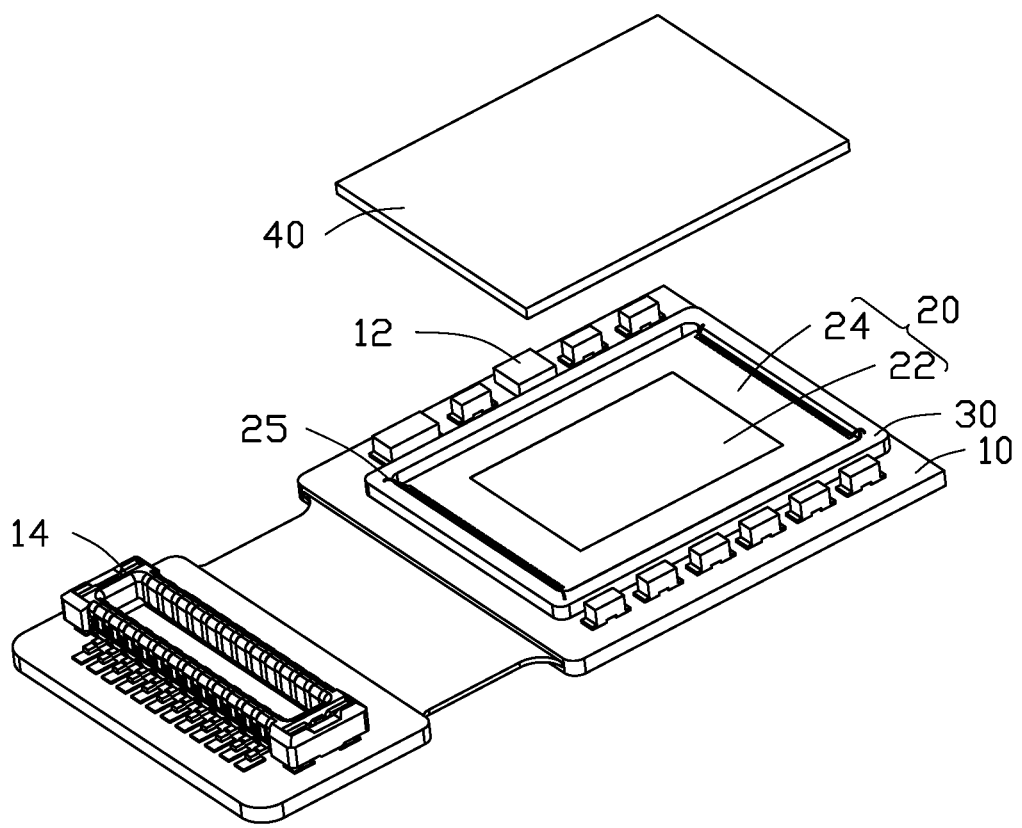
FIG. 6 is an exploded view of the supporting portion and the protecting sheet in FIG. 5 and the printed circuit board in FIG. 2.

In the embodiment, the image sensor chip 20 is mounted on a central area of the printed circuit board 10 via a flip-chip method. As shown in FIG. 6, conductive pads 101, 201 are provided on the printed circuit board 10 and the image sensor chip 20. Wires 25 are applied to electrically connect the image sensor chip 20 and the printed circuit board 10, as shown in FIG. 4. The wires 25 connect to the conductive pads 101, 201 provided on the printed circuit board 10 and the image sensor chip 20. Material of wires 25 may be selected from, but is not limited to, gold, copper, aluminium, silver, etc. In particular, the wires 25 are arced or bent, thereby avoiding bending damage to the wires 25.

At block 103, as shown in FIG. 5 and FIG. 6, a supporting portion 30 is formed on the printed circuit board 10 to surround the image sensor chip 20. The supporting portion 30 encloses the wires 25, to avoid the wires 25 becoming detached from the printed circuit board 10, and to provide a support for the protecting sheet 40. The supporting portion 30 is substantially a square frame. A material of the supporting portion 30 is a dark colloid, to absorb stray light and prevent ghosting. The supporting portion 30 is formed on the printed circuit board 10 by coating. In other embodiment, the supporting portion 30 may also be cylinders arranged independently around the image sensor chip 20. The number of cylinders may be the same as the number of wires 25, each cylinder wraps one wire 25 and the cylinders together structurally support the protecting sheet 40.

Figure 7:
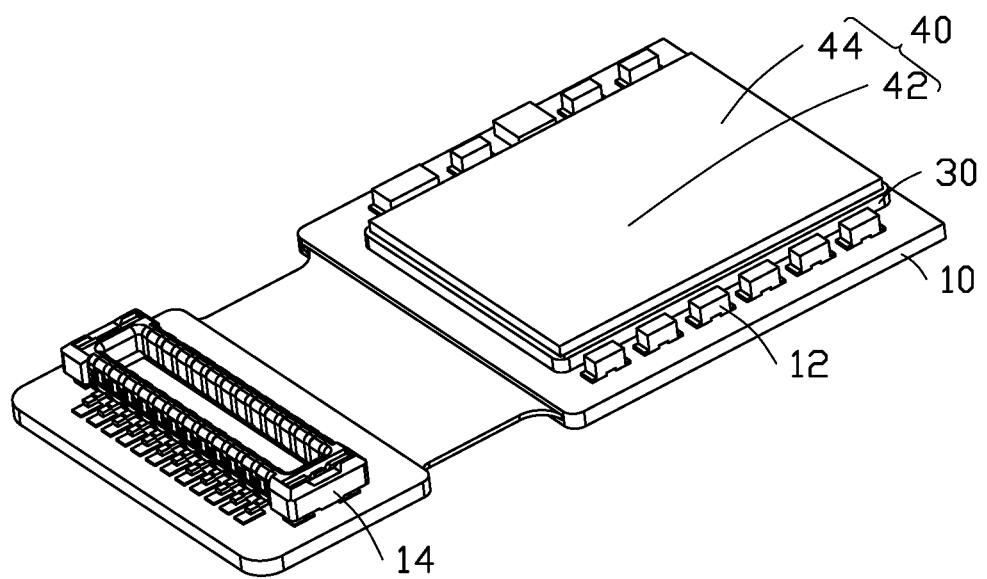
FIG. 7 is an isometric view of the supporting portion and the protecting sheet and the printed circuit board together.

At block 104, as shown in FIGS. 6-7, a protecting sheet 40 is provided and fixed on the supporting portion 30. A size of the protecting sheet 40 is larger than a size of the image sensor chip 20. In the shown embodiment, the protecting sheet 40 is an infrared cut-off filter to filter out infrared light. The protecting sheet 40 is also may be a color filter. The protecting sheet 40 is configured to protect the image sensor chip 20 and avoid dust and fragments from falling on the image sensor chip 20.

The protecting sheet 40 defines a light transmission area 42 and a peripheral area 44 surrounding the light transmission area 42 along an optical path of a lens module. The light transmission area 42 corresponds to the photosensitive area position 22.

Figure 8:
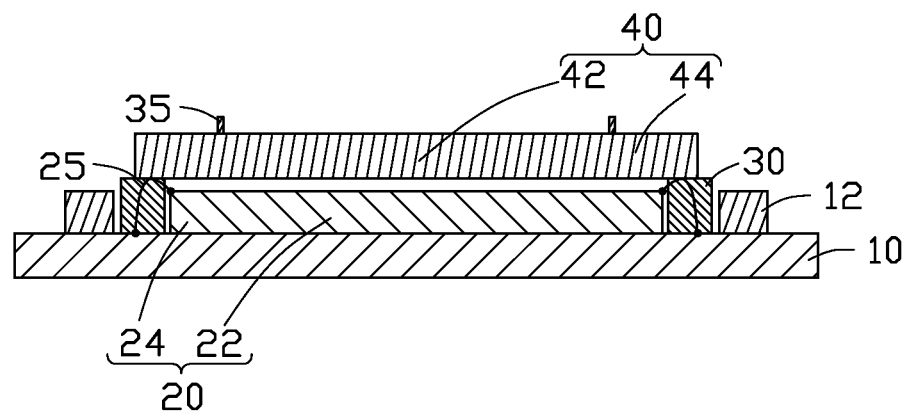
FIG. 8 is a cross-sectional view of a removable glue layer formed on the protecting sheet in FIG. 5.

At block 105, as shown in FIG. 8, a removable glue layer 35 is provided as a retaining wall on a peripheral area 44 of the protecting sheet 40. The removable glue layer 35 protects the light transmission area 42 when forming the package portion 50 in the next step, to prevent molding material or excess material from entering the light transmission area 42 during molding.

Figure 9:
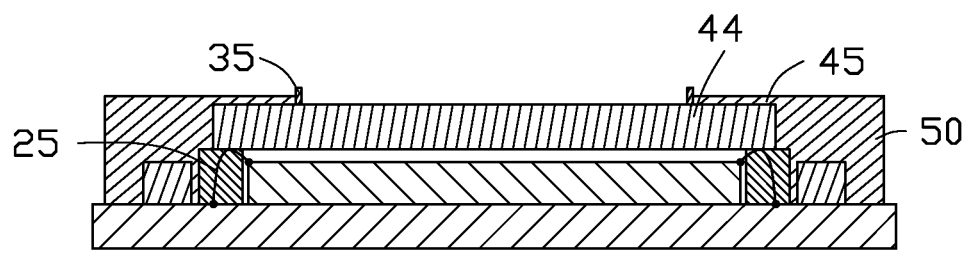
FIG. 9 is a cross-sectional of a chip encapsulation structure formed on the printed circuit board.

At block 106, as shown in FIG. 9, the package portion 50 is formed on the printed circuit board 10. The package portion 50 also packages the circuit components 12 and the wires 25 in its interior so that the circuit components 12 are not directly exposed to air. The package portion 50 has complete opacity. The package portion 50 wraps the side wall of the supporting portion 30, side wall of the protecting sheet 40, and the peripheral area 44 of the protecting sheet 40. A color of the package portion 50 is black or other dark color. The package portion 50 on the peripheral area 44 forms a light shielding layer 45.

The molding material is applied on the peripheral area 44 of the protecting sheet 40 by a flow process, thus thickness of the light shielding layer 45 is controllable. In the embodiment, a thickness of the light shielding layer 45 is in a range from 0.1 millimeters to 0.3 millimeters. The light shielding layer 45 absorbs stray light.

The light shielding layer 45 is formed during the process of molding on chip (MOC). There is thus no need to apply a light-absorbing black paint on the peripheral area 44 of the protecting sheet 40. Production cost of the protecting sheet 40 is reduced. The package portion 50 may be formed by, but is not limited to, an injection molding process or a molding process. The package portion 50 can be selected from but is not limited to nylon, LCP (liquid crystal polymer), PP (Polypropylene, polypropylene), or resin.

At block 107, as shown in FIG. 10, the removable glue layer 35 is removed to achieve the chip encapsulation structure 100.

Figure 12:
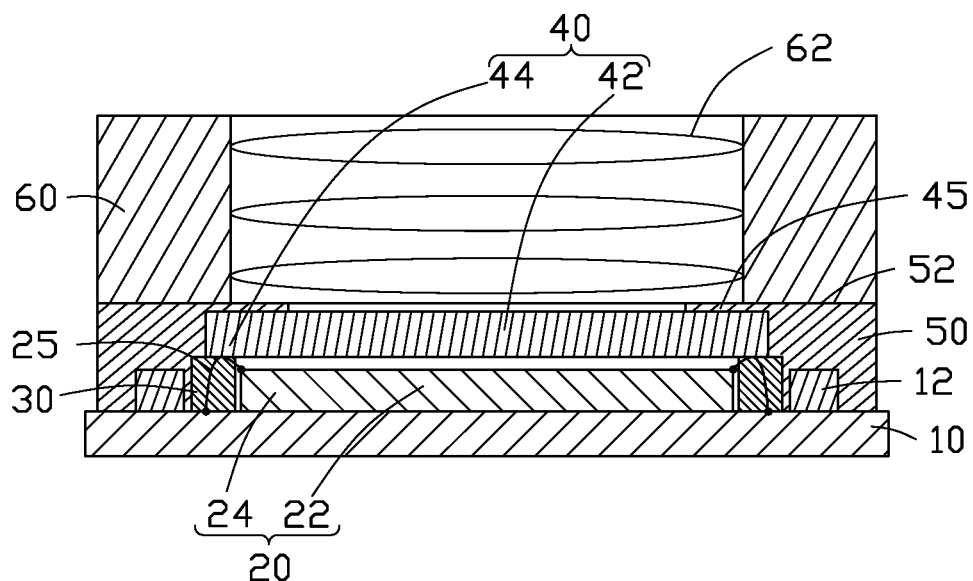
FIG. 12 is a cross-sectional view of the chip encapsulation structure formed as a camera device.

The packaging portion 50 includes a supporting surface 52 away from the printed circuit board 10, and the supporting surface 52 is flat. When the chip encapsulation structure 100 is used to form a camera device 110 as shown in FIG. 12, a lens module 60 is fixed on the supporting surface 52 of the package portion 50. The optical lens 60 includes at least one lens 62. The necessarily close proximity between the at least one lens 62 and the protecting sheet 40 can lead to optical interference, or the at least one lens 62 being physically ruptured. In the embodiment, the light shielding layer 45 increases the distance between the at least one lens 62 and the protecting sheet 40, thus interference between the at least one lens 62 and the protecting sheet 40 is reduced.

Figure 13:
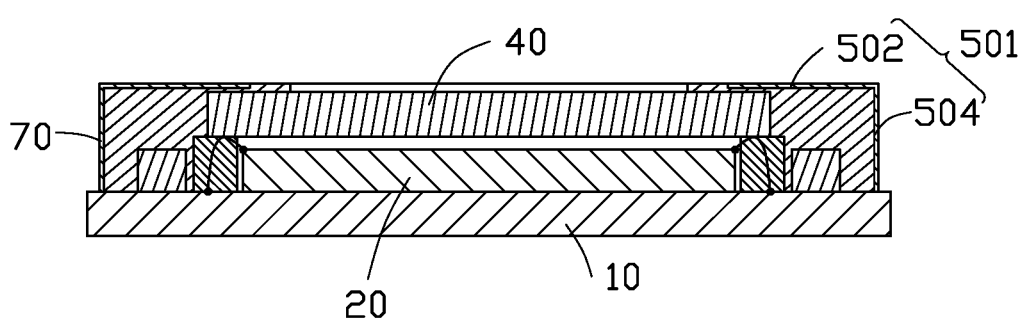
FIG. 13 is an isometric view of a chip encapsulation structure in accordance with one embodiment.

FIG. 13 shows a chip encapsulation structure 200 according to another embodiment. The chip encapsulation structure in FIG. 13 is similar to chip encapsulation structure 100 in FIG. 10. The difference between the chip encapsulation structure 200 and the chip encapsulation structure 100 in FIG. 10 is that the package portion 501 includes a supporting surface 502 away from the printed circuit board 10 and a side surface 504 perpendicular to the supporting surface 502. The package portion 501 further includes a metal sheet 70. The metal sheet 70 is insert molded on the supporting surface 502 and the side surface 504, the metal sheet 70 increases structural strength of the packaging portion 501.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A chip encapsulation structure comprising:
a printed circuit board;
an image sensor chip mounted on the printed circuit board and connected to the printed circuit board via wires, the wires being arced; and
a supporting portion formed on the printed circuit board surrounding the image sensor chip;
a protecting sheet fixed on the supporting portion; and
a package portion formed on the printed circuit board, wherein the package portion has complete opacity and wraps side wall of the supporting portion and side wall of the protecting sheet, the supporting portion further packages the wires in an interior of the supporting portion, and a top end of each of the wires is leveled with a top surface, away from the printed circuit board, of the supporting portion, the wires and the supporting portion cooperatively structurally supporting the protecting sheet.

2. The chip encapsulation structure of claim 1, wherein:
the package portion further covers a portion surface of the protecting sheet away from the image sensor chip, and the package portion locating on the portion surface of the protecting sheet forms a light shielding layer.

3. The chip encapsulation structure of claim 2, wherein:
the protecting sheet defines a light transmission area and a peripheral area surrounding the light transmission area, the light transmission area corresponds to the photosensitive area, and the light shielding layer is formed on the peripheral area.

4. The chip encapsulation structure of claim 3, wherein:
a thickness of the light shielding layer is in a range from 0.1 millimeters to 0.3 millimeters.

5. The chip encapsulation structure of claim 4, wherein:
the supporting portion is substantially a square frame or a plurality of cylinders arranged independently around the image sensor chip; a height of the supporting portion is protruding from a top surface of the image sensor chip, and the protecting sheet is spaced from the image sensor chip.

6. The chip encapsulation structure of claim 1, wherein:
the protecting sheet is an infrared cut-off filter or a color filter.

7. The chip encapsulation structure of claim 6, wherein:
a material of the supporting portion is dark colloid, and the supporting portion wraps the wires.

8. The chip encapsulation structure of claim 1, wherein:
the packaging portion comprises a supporting surface away from the printed circuit board, and the support surface is flat.

9. The chip encapsulation structure of claim 8, wherein:
the package portion further comprises a metal sheet, the metal sheet is substantially L-shaped, and the metal sheet insert molding on the supporting surface and a side surface perpendicularly to the supporting surface.

10. A method for manufacturing a chip encapsulation structure comprising:
providing a printed circuit board;
providing an image sensor chip and mounting the image sensor chip on the printed circuit board the image sensor chip being electrically connected to the printed circuit board via wires, the wires being arced;
providing a supporting portion and mounting the supporting portion on the printed circuit board, the supporting portion surrounds the image sensor chip;
providing a protecting sheet, and fixing the protecting sheet on the supporting portion; and
forming a package portion on the printed circuit board, wherein the package portion is impervious to light and wraps side wall of the side wall of the supporting portion and side wall of the protecting sheet, the supporting portion further packages the wires in an interior of the supporting portion, and a top end of each of the wires is leveled with a top surface, away from the printed circuit board, of the supporting portion, the wires and the supporting portion cooperatively structurally supporting the protecting sheet.

11. The method of claim 10, wherein
before the step of forming a package portion on the printed circuit board further comprises a step of providing a removable glue layer on a peripheral area of the protecting sheet and after the step of forming the package portion, removing the removable glue layer from the protecting sheet.

12. The method of claim 10, wherein
the image sensor chip comprises a photosensitive area and a non-photosensitive area surrounding the photosensitive area, and the supporting portion is fixed on the non-photosensitive area.

13. The method of claim 12, wherein:
the supporting portion further comprises a supporting frame, the supporting frame comprises an aperture, the protecting sheet is mounted with the supporting frame and the aperture exposes portion of the protecting sheet.

14. The method of claim 10, wherein:
the package portion further covers a portion surface of the protecting sheet away from the image sensor chip, and the package portion locating on the portion surface of the protecting sheet forms a light shielding layer.

15. The method of claim 14, wherein:
a thickness of the light shielding layer is in a range from 0.1 millimeters to 0.3 millimeters.

16. The method of claim 14, wherein:
the supporting portion is substantially a square frame or a plurality of cylinders arranged independently around the image sensor chip; a height of the supporting portion is protruding from a top surface of the image sensor chip, and the protecting sheet is spaced from the image sensor chip.

17. A camera module comprising:
a printed circuit board;
an image sensor chip mounted on the printed circuit board and connected to the printed circuit board via wires, the wires being arced; and
a supporting portion formed on the printed circuit board surrounding the image sensor chip;
a protecting sheet fixed on the supporting portion;
a package portion formed on the printed circuit board, wherein the package portion has complete opacity and wraps side wall of the supporting portion and side wall of the protecting sheet, the supporting portion further packages the wires in an interior of the supporting portion, and a top end of each of the wires is leveled with a top surface, away from the printed circuit board, of the supporting portion, the wires and the supporting portion cooperatively structurally supporting the protecting sheet; the package portion comprises a supporting surface, and
a lens module fixed on the supporting surface of the package portion, and wherein bottom end of the lens module is spaced from the protecting sheet via a portion of the package portion.

18. The camera module of claim 17, wherein
the package portion further covers a portion surface of the protecting sheet away from the image sensor chip, and the package portion located on the portion surface of the protecting sheet forms a light shielding layer.

19. The camera module of claim 18, wherein
the light shielding layer comprises a light through hole, and a diameter of an aperture of the light through hole is less than a diameter of a lens received in the lens module.

20. The camera module of claim 17, wherein:
the package portion further comprises a metal sheet, the metal sheet is substantially L-shaped, and the metal sheet is insert molded on the supporting surface and a side surface of the metal sheet being perpendicular to the supporting surface.

* * * * *